(12) United States Patent
Lee et al.

(10) Patent No.: US 10,971,526 B2
(45) Date of Patent: Apr. 6, 2021

(54) PIXEL STRUCTURE WITH ELECTRODE OF TRANSISTOR HAVING U-SHAPED PORTION

(71) Applicant: Au Optronics Corporation, Hsinchu (TW)

(72) Inventors: Min-Tse Lee, Hsinchu (TW);
Sheng-Yen Cheng, Hsinchu (TW);
Yueh-Hung Chung, Taipei (TW);
Ya-Ling Hsu, New Taipei (TW);
Chen-Hsien Liao, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/431,755

(22) Filed: Jun. 5, 2019

(65) Prior Publication Data
US 2020/0058679 A1 Feb. 20, 2020

(30) Foreign Application Priority Data
Aug. 15, 2018 (TW) .................................. 107128514

(51) Int. Cl.
*H01L 27/12* (2006.01)
(52) U.S. Cl.
CPC ........ *H01L 27/124* (2013.01); *H01L 27/1225* (2013.01); *H01L 27/1251* (2013.01)
(58) Field of Classification Search
None
See application file for complete search history.

(56) References Cited

U.S. PATENT DOCUMENTS

| 8,451,393 B2 | 5/2013 | Cho et al. |
| 9,053,663 B1 | 6/2015 | Chen et al. |
| 9,087,490 B2 | 7/2015 | Kim et al. |
| 2011/0096260 A1* | 4/2011 | Cho ................. G02F 1/136213 349/41 |
| 2011/0310057 A1 | 12/2011 | Wang |
| 2015/0145759 A1 | 5/2015 | Chen et al. |

FOREIGN PATENT DOCUMENTS

| CN | 103529611 | 1/2014 |
| CN | 107561804 | 1/2018 |
| CN | 107578700 | 1/2018 |

OTHER PUBLICATIONS

CN107561804 English Translation only, Jan. 2018.*

* cited by examiner

*Primary Examiner* — Daniel Whalen
(74) *Attorney, Agent, or Firm* — JCIPRNET

(57) ABSTRACT

A pixel structure includes a scan line, a data line, a reference voltage line, a first transistor, a second transistor, a third transistor, a first pixel electrode and a second pixel electrode. The reference voltage line is separated from the data line and intersected with the scan line. A first electrode of the second transistor, a second electrode of the second transistor and a first electrode of the third transistor have straight line portions overlapped with a second semiconductor pattern of the second transistor and a third semiconductor pattern of the third transistor. Both ends of each of the straight line portions are located outside a normal projection region of a first semiconductor pattern of the first transistor, a normal projection region of the second semiconductor pattern of the second transistor and a normal projection region of the third semiconductor pattern of the third transistor.

17 Claims, 10 Drawing Sheets

PIXEL STRUCTURE WITH ELECTRODE OF TRANSISTOR HAVING U-SHAPED PORTION

CROSS REFERENCE TO RELATED APPLICATION

This application claims the priority benefit of Taiwan application serial no. 107128514, filed on Aug. 15, 2018. The entirety of the above-mentioned patent application is hereby incorporated by reference herein and made a part of specification.

BACKGROUND

Field of the Disclosure

The disclosure relates to a semiconductor structure, and more particularly to a pixel structure.

Description of Related Art

The display panel has been commonly used in daily life because of its advantages of thinness, small size, and power saving. The display panel includes a pixel array substrate, an opposite substrate opposite to the pixel array substrate, and a display medium disposed between the pixel array substrate and the opposite substrate. The pixel array substrate includes a substrate, a plurality of thin film transistors (TFTs) disposed on the substrate, a plurality of pixel electrodes electrically connected to the plurality of thin film transistors, a plurality of data lines, and a plurality of scan lines, wherein the electrical properties of the thin film transistor affect the performance of the display panel most significantly.

A pixel structure of the display panel may include a first pixel electrode and a second pixel electrode. In general, a thin film transistor for charging a first pixel electrode and a second pixel electrode is typically a U-shaped thin film transistor having a U-shaped channel, and a thin film transistor for adjusting the voltage of the first pixel electrode and the second pixel electrode is typically an I-shaped thin film transistor having a straight channel. However, based on reliability test, the degree of the electrically biased of the U-shaped thin film transistor is different from that of the I-shaped thin film transistor, which results in poor display, such as: color mura, image sticking (IS) and so on.

SUMMARY OF THE DISCLOSURE

The disclosure provides a pixel structure with good performance.

A pixel structure of the disclosure includes a scan line, a data line, a reference voltage line, a first transistor, a second transistor, a third transistor, a first pixel electrode, and a second pixel electrode. The data line and the scan line are intersected. The reference voltage line is spaced apart from the data line and intersected with the scan line. The first transistor has a first semiconductor pattern, a gate, and a first electrode and a second electrode that are separated from each other and electrically connected to the first semiconductor pattern. The second transistor has a second semiconductor pattern, a gate, and a first electrode and a second electrode that are separated from each other and electrically connected to the second semiconductor pattern. The third transistor has a third semiconductor pattern, a gate, and a first electrode and a second electrode that are separated from each other and electrically connected to the third semiconductor pattern. The gate of the first transistor, the gate of the second transistor, and the gate of the third transistor are electrically connected to the same scan line. The first electrode of the first transistor and the first electrode of the second transistor are electrically connected to the same data line. The second electrode of the second transistor is electrically connected to the first electrode of the third transistor. The second electrode of the third transistor is electrically connected to the reference voltage line. The area of the first pixel electrode is smaller than the area of the second pixel electrode. The second electrode of the first transistor is electrically connected to the first pixel electrode, and the second electrode of the second transistor is electrically connected to the second pixel electrode. The first electrode of the second transistor, the second electrode of the second transistor, and the first electrode of the third transistor have a plurality of straight line portions, and the plurality of straight line portions overlap the second semiconductor pattern and the third semiconductor pattern. Both ends of each straight line portion are located outside the normal projection regions of the first semiconductor pattern, the second semiconductor pattern, and the third semiconductor pattern.

Based on the above, the pixel structure in an embodiment of the disclosure includes a scan line, a data line, a reference voltage line, a first transistor, a second transistor, a third transistor, a first pixel electrode, and a second pixel electrode, wherein each of the transistors has a first electrode and a second electrode respectively, the first electrode of the second transistor, the second electrode of the second transistor, and the first electrode of the third transistor have a plurality of straight line portions, and the plurality of straight line portions overlap the second semiconductor pattern and the third semiconductor pattern. In particular, both ends of each straight line portions are located outside the normal projection regions of the first semiconductor pattern, the second semiconductor pattern, and the third semiconductor pattern. In this manner, the display panel using the above pixel structure is less likely to exhibit a display defect after being tested for reliability.

In order to make the aforementioned features and advantages of the disclosure more comprehensible, embodiments accompanying figures are described in detail below.

DESCRIPTION OF EMBODIMENTS

Figure 1:
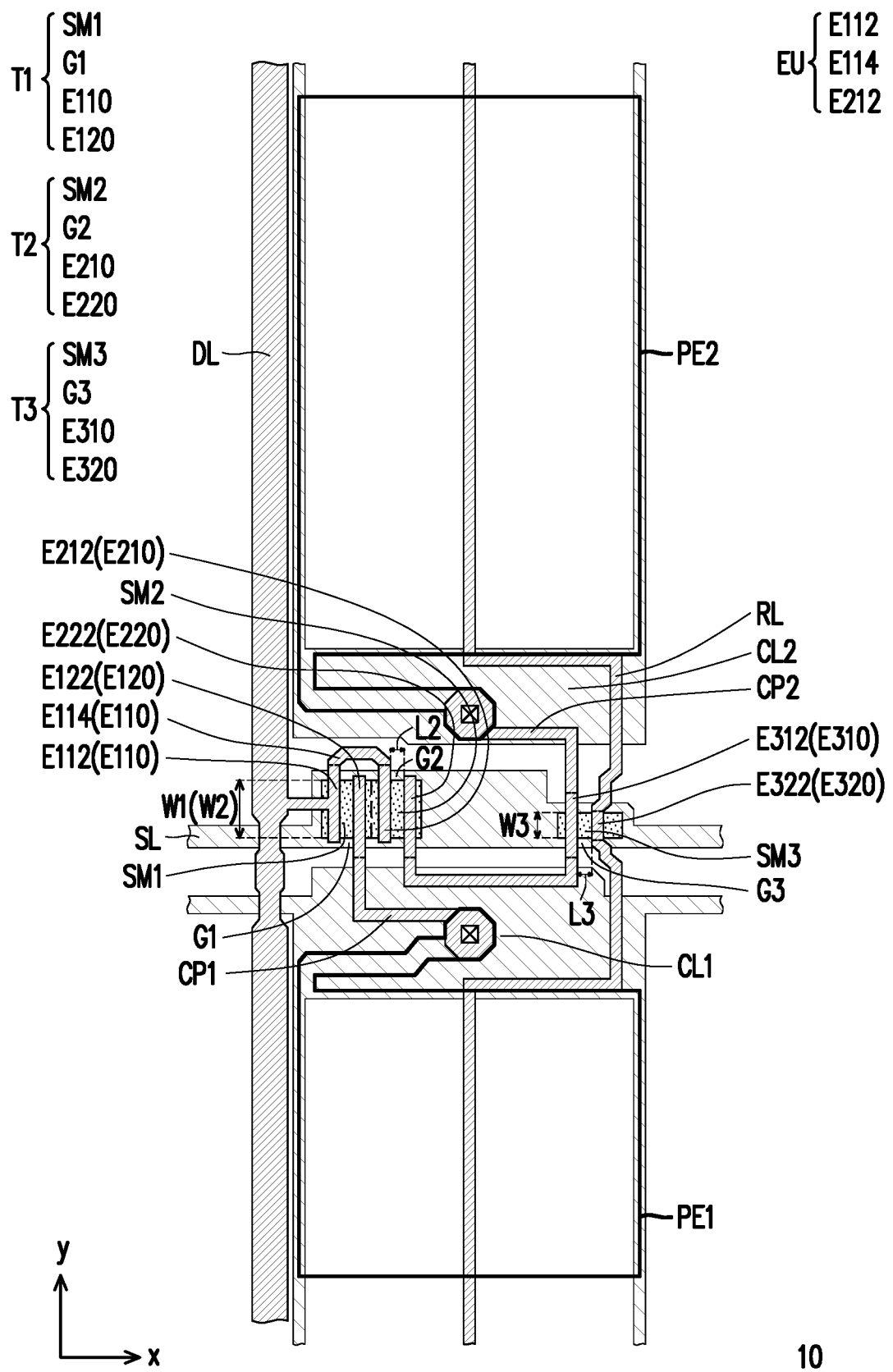
FIG. 1 is a schematic top view of a pixel structure according to an embodiment of the disclosure.

The present disclosure will be described more thoroughly below with the accompanying drawings, and exemplary embodiments of the present disclosure are shown in the drawings. As will be appreciated by those skilled in the art, the described embodiments may be modified in a variety of different ways without departing from the spirit or scope of the disclosure.

Unless otherwise defined, all terms (including technical and scientific terms) used for this disclosure herein have meanings commonly understood by one having ordinary skill in the art. It should be further understood that the terms used in the context of the related art and the present disclosure can be interpreted with meanings found in the commonly used dictionaries, and should not be construed to certain meanings unless explicitly defined herein.

Exemplary embodiments are described with ideal schematic or cross-sectional illustrations. Thus, shape alterations as a result of, for example, manufacturing techniques and/or tolerances are something to consider, and the illustrated regions of the embodiments described herein should not be construed to particular shapes. For example, regions shown or described as being flat may generally have rough and/or non-linear features. Furthermore, the acute angles shown may be round. Therefore, the regions illustrated in the figures are only schematic representations and are not intended to illustrate the exact shapes of the regions or to limit the scope of the claims.

FIG. 1 is a schematic top view of a pixel structure according to an embodiment of the disclosure.

Referring to FIG. 1, a pixel structure 10 of the embodiment includes a scan line SL, a data line DL, a reference voltage line RL, a first transistor T1, a second transistor T2, a third transistor T3, a first pixel electrode PE1 and second pixel electrode PE2. In the embodiment, the pixel structure 10 may further include a common electrode CL1, a common electrode CL2, a conductive pattern CP1, and a conductive pattern CP2, but the disclosure is not limited thereto.

The data line DL is intersected with the scan line SL. In the embodiment, it is exemplified that the extending direction of the scan line SL is not parallel to the extending direction of the data line DL. The scan line SL substantially extends in a second direction x. The data line DL substantially extends in a first direction y. The first direction x is intersected with the second direction y. For example, in the embodiment, the first direction x may be perpendicular to the second direction y, but the disclosure is not limited thereto. The scan line SL and the data line DL are generally made of a metal material. However, the disclosure is not limited thereto. In other embodiments, the scan line SL and the data line DL may be formed of other conductive materials (for example, a nitride of a metal material, an oxide of a metal material, an oxynitride of a metal material, or other suitable material) or a stacked layer of a metal material and other conductive materials.

The reference voltage line RL is spaced apart from the data line DL, and the reference voltage line RL is intersected with the scan line SL. For example, in the embodiment, the portion of the reference voltage line RL that overlaps the first pixel electrode PE1 and the second pixel electrode PE2 may be substantially parallel to the data line DL, but the disclosure is not limited thereto. In the embodiment, the reference voltage line RL and the data line DL may be formed in the same film layer, and the material of the reference voltage line RL and the material of the data line DL may be the same, but the disclosure is not limited thereto.

The common electrodes CL1 and CL2 are spaced apart from the scan line SL. The common electrode CL1 and the common electrode CL2 are respectively located on both sides of the scan line SL. In the embodiment, the common electrode CL1, the common electrode CL2, and the scan line SL may be formed in the same film layer, and the material of the common electrode CL1, the material of the common electrode CL2 and the material of the scan line SL may be the same, but the disclosure is not limited thereto.

The second electrode E120 of the first transistor T1 is electrically connected to the first pixel electrode PE1 through the conductive pattern CP1. The second electrode E220 of the second transistor T2 is electrically connected to the second pixel electrode PE2 through the conductive pattern CP2. In the embodiment, the conductive pattern CP1, the conductive pattern CP2 and the data line DL may be formed in the same film layer, and the material of the conductive pattern CP1, the material of the conductive pattern CP2 and the material of the data line DL may be the same, but the disclosure is not limited thereto.

In the embodiment, the area of the first pixel electrode PE1 is smaller than the area of the second pixel electrode PE2. The pixel structure 10 may include a main pixel and a sub pixel, wherein the first pixel electrode PE1 may be regarded as a pixel electrode of the main pixel, and the second pixel electrode PE2 may be regarded as a pixel electrode of the sub pixel. FIG. 1 schematically shows the first pixel electrode PE1 and the second pixel electrode PE2 as two patterns that are rectangle-like. However, the disclosure is not limited thereto, and those skilled in the art may design patterns of the first pixel electrode PE1 and the second pixel electrode PE2 according to actual needs. For example, in an embodiment, the first pixel electrode PE1 (or the second pixel electrode PE2) may have two main trunk portions disposed in an intersecting manner and a plurality groups of branches connected to the two main trunk portions. The two main trunk portions define four quadrants, and the plurality groups of branches may be respectively disposed in the four quadrants. In the embodiment, the first pixel electrode PE1 and the second pixel electrode PE2 are, for example, transmissive pixel electrodes. However, the disclosure is not limited thereto. In other embodiments, the first pixel electrode PE1 and the second pixel electrode PE2 may also be reflective pixel electrodes or transflective pixel electrodes. The material of the transmissive pixel electrode includes a metal oxide such as indium tin oxide, indium zinc oxide, aluminum tin oxide, aluminum zinc oxide, indium germanium zinc oxide, other suitable oxide, or a stacked layer of at least two of the above. The material of the reflective pixel electrode includes a metal material having high reflectivity, such as aluminum, silver or other suitable material.

In the embodiment, the common electrode CL1 partially overlaps the conductive pattern CP1 and the first pixel electrode PE1 to form a storage capacitor of the main pixel; the common electrode CL2 partially overlaps the conductive pattern CP2 and the second pixel electrode PE2 to form the storage capacitor of the sub pixel, but the disclosure is not limited thereto.

The first transistor T1 has a first semiconductor pattern SM1, a gate G1, and a first electrode E110 and a second electrode E120 that are separated from each other and electrically connected to the first semiconductor pattern SM1. The second transistor T2 has a second semiconductor pattern SM2, a gate G2, and a first electrode E210 and a second electrode E220 that are separated from each other and electrically connected to the second semiconductor pattern SM2. The third transistor T3 has a third semiconductor pattern SM3, a gate G3, and a first electrode E310 and a second electrode E320 that are separated from each other and electrically connected to the third semiconductor pattern SM3.

In the embodiment, the first semiconductor pattern SM1 is directly connected to the second semiconductor pattern SM2, and the third semiconductor pattern SM3 is separated from the first semiconductor pattern SM1 and the second semiconductor pattern SM2, but the disclosure is not limited thereto. In other embodiments, the first semiconductor pattern SM1, the second semiconductor pattern SM2, and the third semiconductor pattern SM3 may be directly connected. The first semiconductor pattern SM1, the second semiconductor pattern SM2, and the third semiconductor pattern SM3 may be a single layer or a multilayer structure including amorphous silicon, polysilicon, microcrystalline silicon, monocrystalline silicon, an organic semiconductor material, an oxide semiconductor material (for example: indium zinc oxide, indium gallium zinc oxide, other suitable materials or combinations thereof), other suitable materials, the above materials containing dopants or a combination of the above. The material of the first semiconductor pattern SM1 and the material of the second semiconductor pattern SM2 may be the same as or different from the material of the third semiconductor pattern SM3.

The gate G1 of the first transistor T1, the gate G2 of the second transistor T2, and the gate G3 of the third transistor T3 are electrically connected to the same scan line SL. In the embodiment, the gates G1, G2, and G3 may be regarded as wide portions of the scan line SL, but the disclosure is not limited thereto. The materials of the gates G1, G2, and G3 are materials having good conductivity. For example, the materials of the gates G1, G2, and G3 include, for example, copper (Cu), molybdenum (Mo), titanium (Ti), aluminum (Al), tungsten (W), silver (Ag), gold (Au), an alloy of the above metals or a combination of the above. The gates G1, G2, and G3 may be a single layer structure or a multilayer structure.

The first electrode E110 of the first transistor T1 and the first electrode E210 of the second transistor T2 are electrically connected to the same data line DL. The second electrode E320 of the third transistor T3 is electrically connected to the reference voltage line RL. That is, the first electrode E110 of the first transistor T1 is, for example, the source of the first transistor T1; the first electrode E210 of the second transistor T2 is, for example, the source of the second transistor T2; the second electrode E320 of the third transistor T3 is, for example, the source of the third transistor T3. In the embodiment, the reference voltage line RL may have a reference potential, and the voltages allocated to the first pixel electrode PE1 and the second pixel electrode PE2 may be controlled by adjusting the reference potential, thereby improving the defect of color washout of the display panel using the pixel structure 10.

The second electrode E120 of the first transistor T1 is electrically connected to the first pixel electrode PE1. The second electrode E220 of the second transistor T2 is electrically connected to the second pixel electrode PE2, and the second electrode E220 of the second transistor T2 is electrically connected to the first electrode E310 of the third transistor T3. That is, the second electrode E120 of the first transistor T1 is, for example, the drain of the first transistor T1; the second electrode E220 of the second transistor T2 is, for example, the drain of the second transistor T2; the first electrode E310 of the third transistor T3 is, for example, the drain of the third transistor T3. In the embodiment, the source and the drain may be a single layer structure or a multilayer stacked composite structure. The material of the source and the drain may be the same as or different from the material of the gate.

It should be noted that the first electrode E210 of the second transistor T2, the second electrode E220 of the second transistor T2, and the first electrode E310 of the third transistor T3 have a plurality of straight line portions E212, E222, E312, and the plurality of straight line portions E212, E222, and E312 overlap the second semiconductor pattern SM2 and the third semiconductor pattern SM3. Specifically, in the embodiment, the first electrode E210 of the second transistor T2 has the straight line portion E212, the second electrode E220 of the second transistor T2 has the straight line portion E222, and the first electrode E310 of the third transistor T3 has the straight line portion E312. The straight line portion E212 and the straight line portion E222 overlap the second semiconductor pattern SM2, and the straight line portion E312 overlaps the third semiconductor pattern SM3. In the embodiment, both ends of the respective straight line portion E212, the straight line portion E222, and the straight line portion E312 are located outside the normal projection regions of the first semiconductor pattern SM1, the second semiconductor pattern SM2, and the third semiconductor pattern SM3.

In the embodiment, the straight line portion E212, the straight line portion E222, and the straight line portion E312 are extended in the first direction y. In a second direction x intersected with the first direction y, the second transistor T2 has a channel length L2 between the first electrode E210 and the second electrode E220. In the first direction y, the second semiconductor pattern SM2 of the second transistor T2 has a channel width W2. In the second direction x, the third transistor T3 has a channel length L3 between the first electrode E310 and the second electrode E320. In the first direction y, the third semiconductor pattern SM3 of the third transistor T3 has a channel width W3. For example, in the embodiment, $3\ \mu m \leq L3 \leq 4 \times L2$. In the embodiment, $(W3/L3) < (W2/L2)$; further, $W3 < W2$, and $L3 = L2$, but the disclosure is not limited thereto.

In the embodiment, the first electrode E110 of the first transistor T1 has a straight line portion E112, the second electrode E120 of the first transistor T1 has a straight line portion E122, and the second electrode E320 of the third transistor T3 has a straight line portion E322. In the embodiment, the straight line portion E112 of the first electrode E110 of the first transistor T1 and the straight line portion E122 of the second electrode E120 of the first transistor T1 overlap the first semiconductor pattern SM1, and the straight line portion E322 of the second electrode E320 of the third transistor T3 overlaps the third semiconductor pattern SM3. In the embodiment, both ends of the straight line portion E112 of the first electrode E110 of the first transistor T1, the straight line portion E122 of the second electrode E120 of the first transistor T1, and the straight line portion E322 of the second electrode E320 of the third transistor T3 are located outside the normal projection regions of the first semiconductor pattern SM1, the second semiconductor pattern SM2, and the third semiconductor pattern SM3. In the embodiment, the straight line portion E112 of the first electrode E110 of the first transistor T1, the straight line portion E122 of the second electrode E120 of the first transistor T1, the straight line portion E322 of the second electrode E320 of the third transistor T3, the straight line portion E212 of the first electrode E210 of the second transistor T2, the straight line portion E222 of the second electrode E220 of the second transistor T2, and the straight line portion E312 of the first electrode E310 of the third transistor T3 are disposed in parallel.

In the embodiment, the pixel structure 10 further includes a curved section E114 connected between the straight line portion E112 of the first electrode E110 of the first transistor T1 and the straight line portion E212 of the first electrode E210 of the second transistor T2. The straight line portion E112 of the first electrode E110 of the first transistor T1, the curved section E114, and the straight line portion E212 of the first electrode E210 of the second transistor T2 are connected to a U-shaped portion EU. In the embodiment, the U-shaped portion EU may be regarded as the first electrode E110 of the first transistor T1, and the straight line portion E212 of the first electrode E210 of the second transistor T2 may be a part of the U-shaped portion EU. In the embodiment, the curved section E114 of the U-shaped portion EU is located outside the normal projection regions of the first semiconductor pattern SM1, the second semiconductor pattern SM2, and the third semiconductor pattern SM3, but the disclosure is not limited thereto. In the embodiment, both ends of the U-shaped portion EU (i.e., one end of the straight line portion E112 away from the curved section E114 and one end of the straight line portion E212 away from the curved section E114) and the curved section E114 are located outside the normal projection regions of the first semiconductor pattern SM1, the second semiconductor pattern SM2 and the third semiconductor pattern SM3, but the disclosure is not limited thereto.

Based on the above, in the pixel structure 10 of an embodiment of the disclosure, the first electrode E210 of the second transistor T2, the second electrode E220 of the second transistor T2, and the first electrode E310 of the third transistor T3 have a plurality of straight line portions E212, E222, and E312, and both ends of each of the straight line portions E212, E222, and E312 are located outside the normal projection regions of the first semiconductor pattern SM1, the second semiconductor pattern SM2, and the third semiconductor pattern SM3. In this manner, after the reliability test, the degree of the electrically biased of the second transistor T2 can be closer to the degree of the electrically biased of the third transistor T3, so that the display panel using the pixel structure 10 is not easily affected by the difference in the degree of the electrically biased of the plurality of transistors and thus avoiding the problem of display failure (mura).

Figure 2:
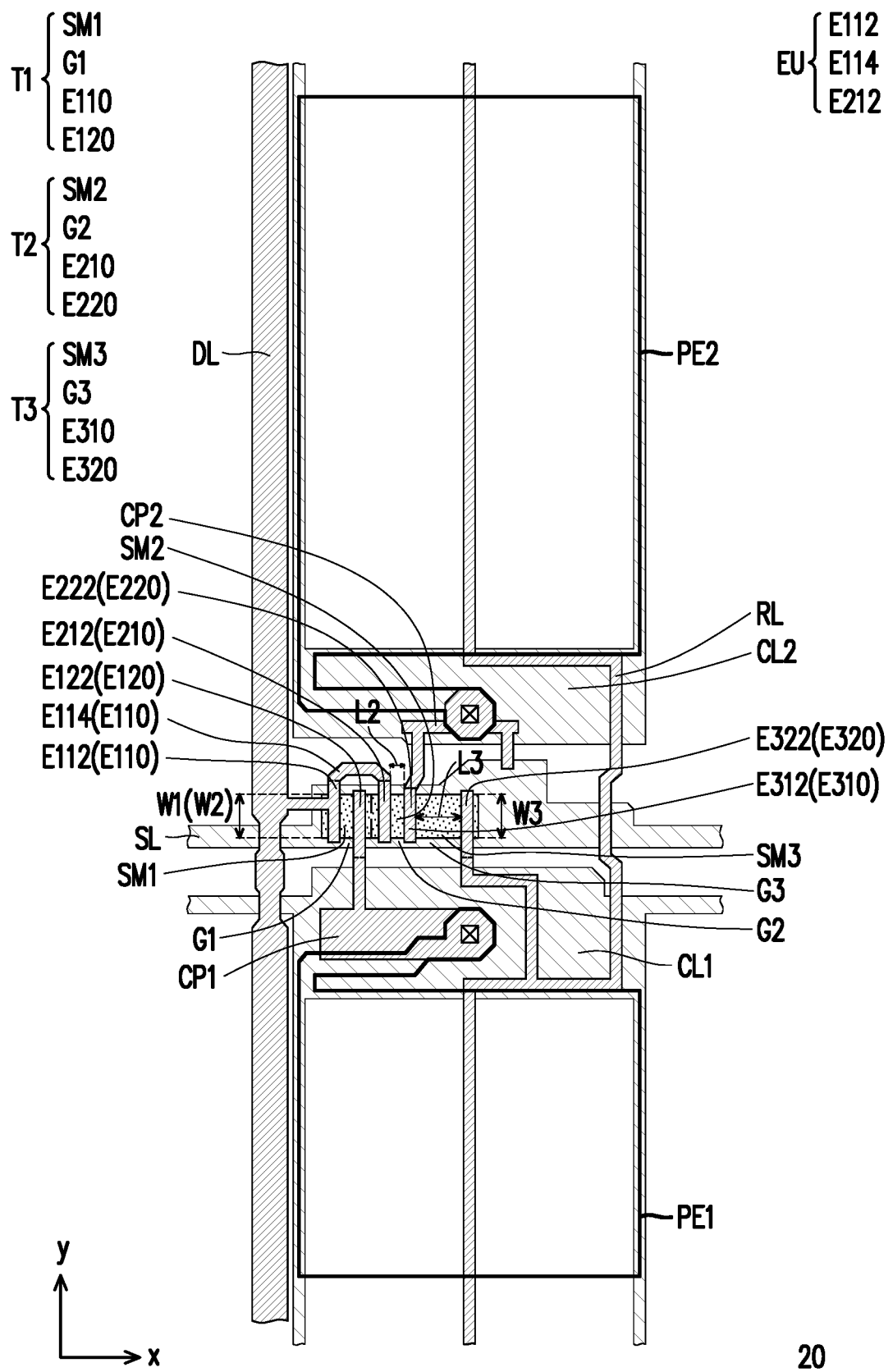
FIG. 2 is a schematic top view of a pixel structure according to another embodiment of the disclosure.

FIG. 2 is a schematic top view of a pixel structure according to another embodiment of the disclosure. It should be noted that the embodiment of FIG. 2 adopts the same reference numerals and parts of the embodiment of FIG. 1, wherein the same or similar reference numerals are used to denote the same or similar elements, and the same technical content is omitted. The omitted descriptions may be derived from the above embodiments and thus no repetition is incorporated herein.

The main difference between the embodiment of FIG. 2 and the embodiment of FIG. 1 is that the first semiconductor pattern SM1, the second semiconductor pattern SM2, and the third semiconductor pattern SM3 are configured differently.

Referring to FIG. 2, in a pixel structure 20 of the embodiment, the first semiconductor pattern SM1 of the first transistor T1, the second semiconductor pattern SM2 of the second transistor T2, and the third semiconductor pattern SM3 of the third transistor T3 are directly connected.

In the embodiment, the first semiconductor pattern SM1 of the first transistor T3 has a channel width W1 in the first direction y, and the second semiconductor pattern SM2 of the second transistor T2 has a channel width W2 in the first direction y. The third semiconductor pattern SM3 of the third transistor T3 has a channel width W3 in the first direction y, and W3=W2=W1.

In the embodiment, the second transistor T2 has a channel length L2 between the first electrode E210 and the second electrode E220 in the second direction x, and the third transistor T3 has a channel length L3 between the first electrode E310 and the second electrode E320 in the second direction x, and L3>L2.

Similarly, in the pixel structure 20 of an embodiment of the disclosure, the first electrode E210 of the second transistor T2, the second electrode E220 of the second transistor T2, and the first electrode E310 of the third transistor T3 have a plurality of straight line portions E212, E222, and E312, and both ends of each of the straight line portions E212, E222, and E312 are located outside the normal projection regions of the first semiconductor pattern SM1, the second semiconductor pattern SM2, and the third semiconductor pattern SM3. In this manner, after the reliability test, the degree of the electrically biased of the second transistor T2 can be closer to the degree of the electrically biased of the third transistor T3, so that the display panel using the pixel structure 20 is not easily affected by the difference in the degree of the electrically biased of the plurality of transistors and thus avoiding the problem of display failure (mura).

Figure 3:
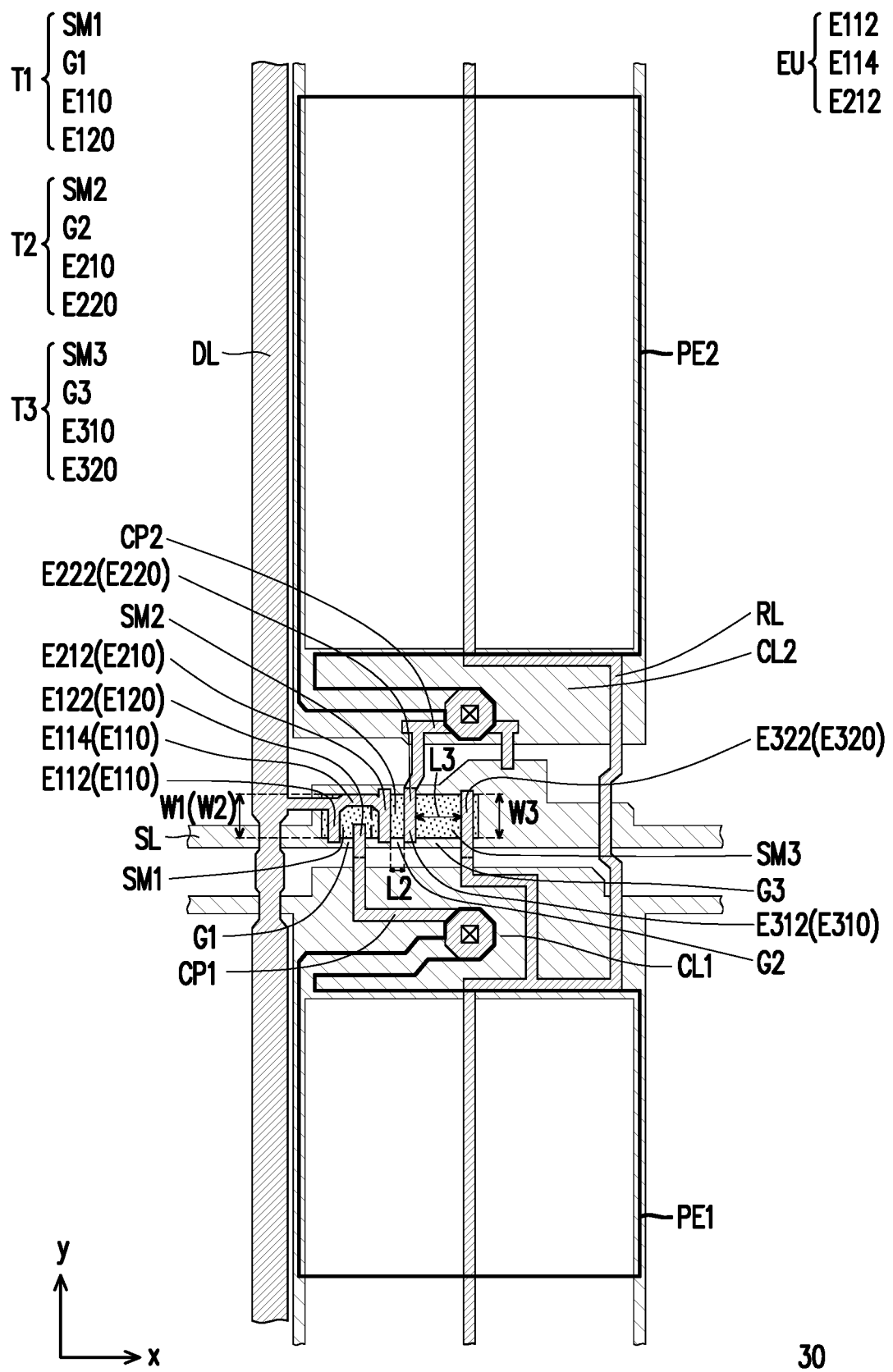
FIG. 3 is a schematic top view of a pixel structure according to still another embodiment of the disclosure.

FIG. 3 is a schematic top view of a pixel structure according to still another embodiment of the disclosure. It should be noted that the embodiment of FIG. 3 adopts the same reference numerals and parts of the embodiment of FIG. 2, wherein the same or similar reference numerals are used to denote the same or similar elements, and the same technical content is omitted. The omitted descriptions may be derived from the above embodiments and thus no repetition is incorporated herein.

The main difference between the embodiment of FIG. 3 and the embodiment of FIG. 2 is that the curved sections E114 of the U-shaped portion EU of the first electrode E110 of the first transistor T1 are configured differently.

Referring to FIG. 3, in a pixel structure 30 of the embodiment, the curved section E114 of the U-shaped portion EU of the first electrode E110 of the first transistor T1 is located within the normal projection regions of the first semiconductor pattern SM1. In the embodiment, both ends of the straight line portion E212 of the first electrode E210 of the second transistor T2 are located outside the normal projection region of the second semiconductor pattern SM2. Additionally, the first electrode E110 (or the U-shaped portion EU) of the first transistor T1 and the first electrode E210 (or the straight line portion E212) of the second transistor T2 are connected to form an n-type conductive pattern.

In the embodiment, the first transistor T1 has a channel length L1 between the first electrode E110 and the second electrode E120 in the second direction x, $3 \leq (W1/L1) \leq 8$, but the disclosure is not limited thereto.

Similarly, in a pixel structure 30 of an embodiment of the disclosure, the first electrode E210 of the second transistor T2, the second electrode E220 of the second transistor T2, and the first electrode E310 of the third transistor T3 have a plurality of straight line portions E212, E222, and E312, and both ends of each of the straight line portions E212, E222, and E312 are located outside the normal projection regions of the first semiconductor pattern SM1, the second semiconductor pattern SM2, and the third semiconductor pattern SM3. In this manner, after the reliability test, the degree of the electrically biased of the second transistor T2 can be closer to the degree of the electrically biased of the third transistor T3, so that the display panel using the pixel structure 30 is not easily affected by the difference in the degree of the electrically biased of the plurality of transistors and thus avoiding the problem of display failure (mura).

Figure 4:
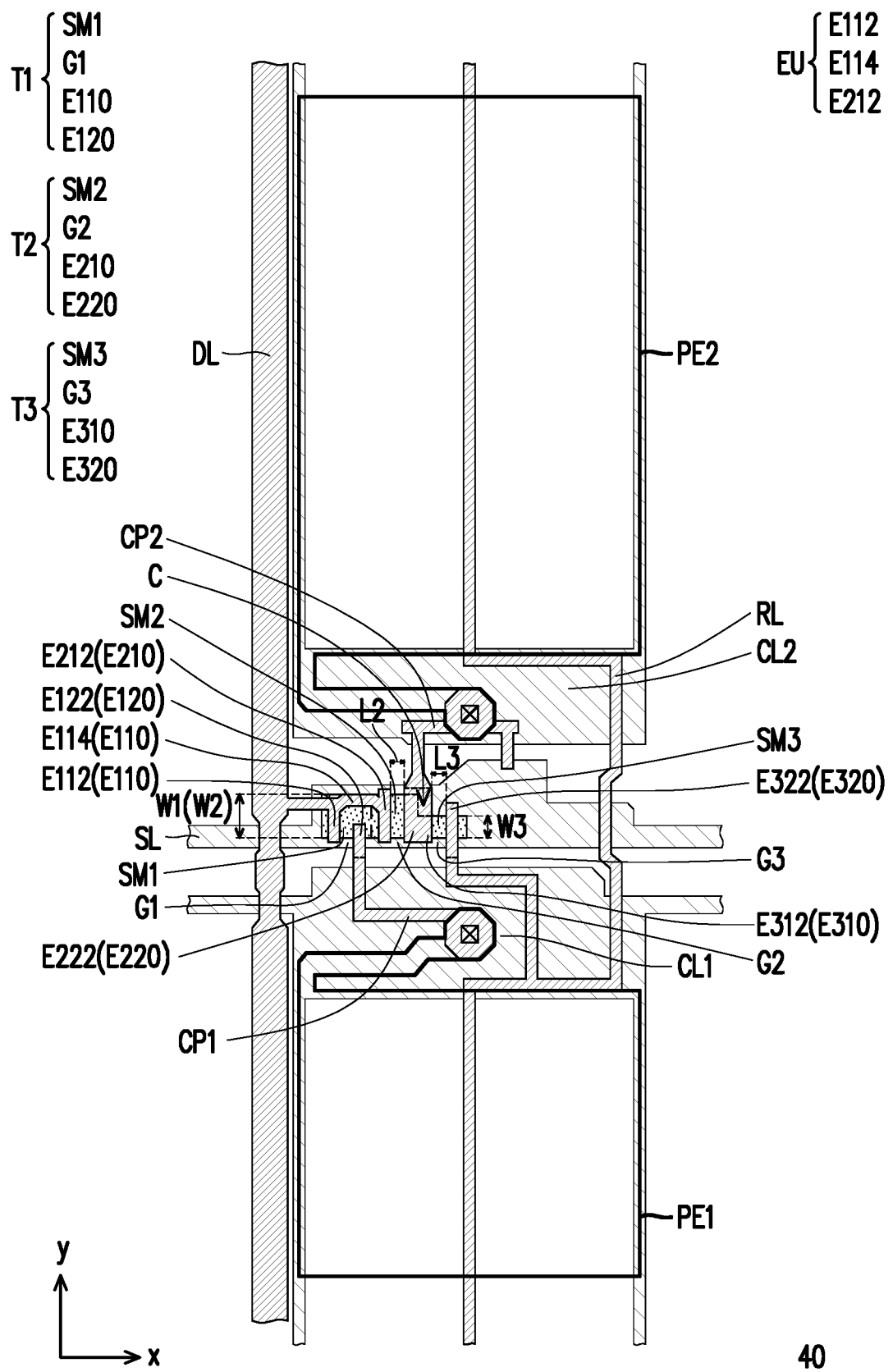
FIG. 4 is a schematic top view of a pixel structure according to yet another embodiment of the disclosure.

FIG. 4 is a schematic top view of a pixel structure according to yet another embodiment of the disclosure. It should be noted that the embodiment of FIG. 4 adopts the same reference numerals and parts of the embodiment of FIG. 3, wherein the same or similar reference numerals are used to denote the same or similar elements, and the same technical content is omitted. The omitted descriptions may be derived from the above embodiments and thus no repetition is incorporated herein.

The main difference between the embodiment of FIG. 4 and the embodiment of FIG. 3 is that the size relationships between the channel width W3 and the channel width W2 are different, and the size relationships between the channel length L3 and the channel length L2 are different.

Referring to FIG. 4, in a pixel structure 40 of the embodiment, the second transistor T2 has a channel length L2 between the first electrode E210 and the second electrode E220 in the second direction x, and the third transistor T3 has a channel length L3 between the first electrode E310 and the second electrode E320 in the second direction x, L3=L2.

In the embodiment, the second semiconductor pattern SM2 of the second transistor T2 has a channel width W2 in the first direction y, and the third semiconductor pattern SM3 of the third transistor T3 has a channel width W3 in the first direction y, W3<W2.

In the embodiment, the second semiconductor pattern SM2 is directly connected to the third semiconductor pattern SM3 to form a corner C. The straight line portion E222 of the second electrode E220 of the second transistor T2 overlaps the corner C. In the embodiment, the line width of the straight line portion E222 of the second electrode E220 of the second transistor T2 is larger than the line width of the straight line portion E212 of the first electrode E210 of the second transistor T2 to cover the corner C, but the disclosure is not limited thereto.

Similarly, in the pixel structure 40 of an embodiment of the disclosure, the first electrode E210 of the second transistor T2, the second electrode E220 of the second transistor T2, and the first electrode E310 of the third transistor T3 have a plurality of straight line portions E212, E222, and E312, and both ends of each of the straight line portions E212, E222, and E312 are located outside the normal projection regions of the first semiconductor pattern SM1, the second semiconductor pattern SM2, and the third semiconductor pattern SM3. In this manner, after the reliability test, the degree of the electrically biased of the second transistor T2 can be closer to the degree of the electrically biased of the third transistor T3, so that the display panel using the pixel structure 40 is not easily affected by the difference in the degree of the electrically biased of the plurality of transistors and thus avoiding the problem of display failure (mura).

Figure 5:
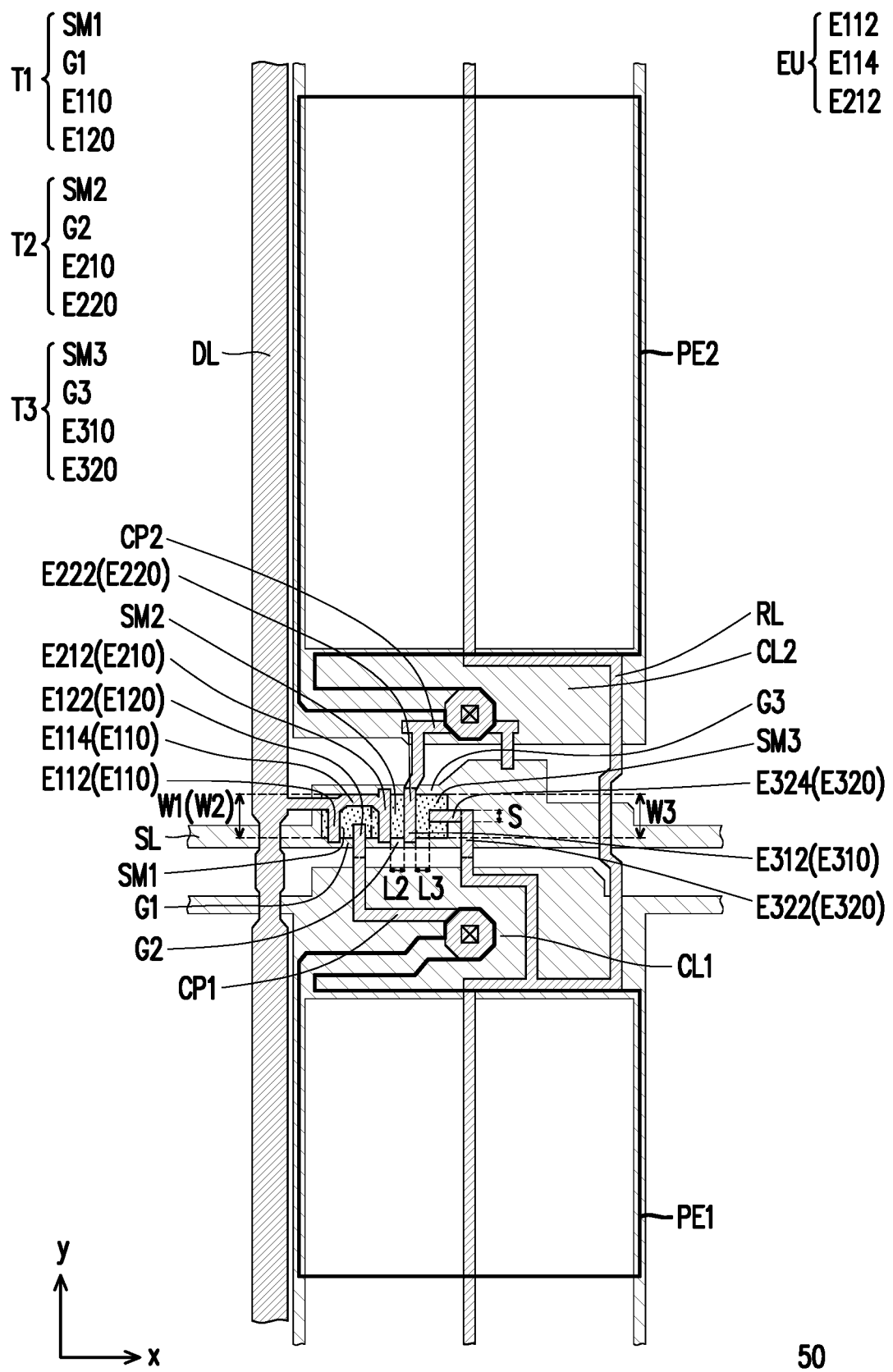
FIG. 5 is a schematic top view of a pixel structure according to still another embodiment of the disclosure.

FIG. 5 is a schematic top view of a pixel structure according to still another embodiment of the disclosure. It should be noted that the embodiment of FIG. 5 adopts the same reference numerals and parts of the embodiment of FIG. 3, wherein the same or similar reference numerals are used to denote the same or similar elements, and the same technical content is omitted. The omitted descriptions may be derived from the above embodiments and thus no repetition is incorporated herein.

The main difference between the embodiment of FIG. 5 and the embodiment of FIG. 3 is that the second electrode E320 of the third transistor T3 further has a transverse line portion E324.

Referring to FIG. 5, in a pixel structure 50 of the embodiment, the second electrode E320 of the third transistor T3 has a second transverse line portion E324. The second transverse line portion E324 is intersected with the straight line portion E312 of the first electrode E310 of the third transistor T3, and one end of the second transverse line portion E324 is located within the normal projection region of the third semiconductor pattern SM3. In the embodiment, the line width S of the second transverse line portion E324 is smaller than the channel width W3 of the third semiconductor pattern SM3 of the third transistor T3.

In the embodiment, the second transistor T2 has a channel length L2 between the first electrode E210 and the second electrode E220 in the second direction x, and the third transistor T3 has a channel length L3 between the first electrode E310 and the second electrode E320 in the second direction x, L3=L2.

Similarly, in the pixel structure 50 of an embodiment of the disclosure, the first electrode E210 of the second transistor T2, the second electrode E220 of the second transistor T2, and the first electrode E310 of the third transistor T3 have a plurality of straight line portions E212, E222, and E312, and both ends of each of the straight line portions E212, E222, and E312 are located outside the normal projection regions of the first semiconductor pattern SM1, the second semiconductor pattern SM2, and the third semiconductor pattern SM3. In this manner, after the reliability test, the degree of the electrically biased of the second transistor T2 can be closer to the degree of the electrically biased of the third transistor T3, so that the display panel using the pixel structure 50 is not easily affected by the difference in the degree of the electrically biased of the plurality of transistors and thus avoiding the problem of display failure (mura).

Figure 6:
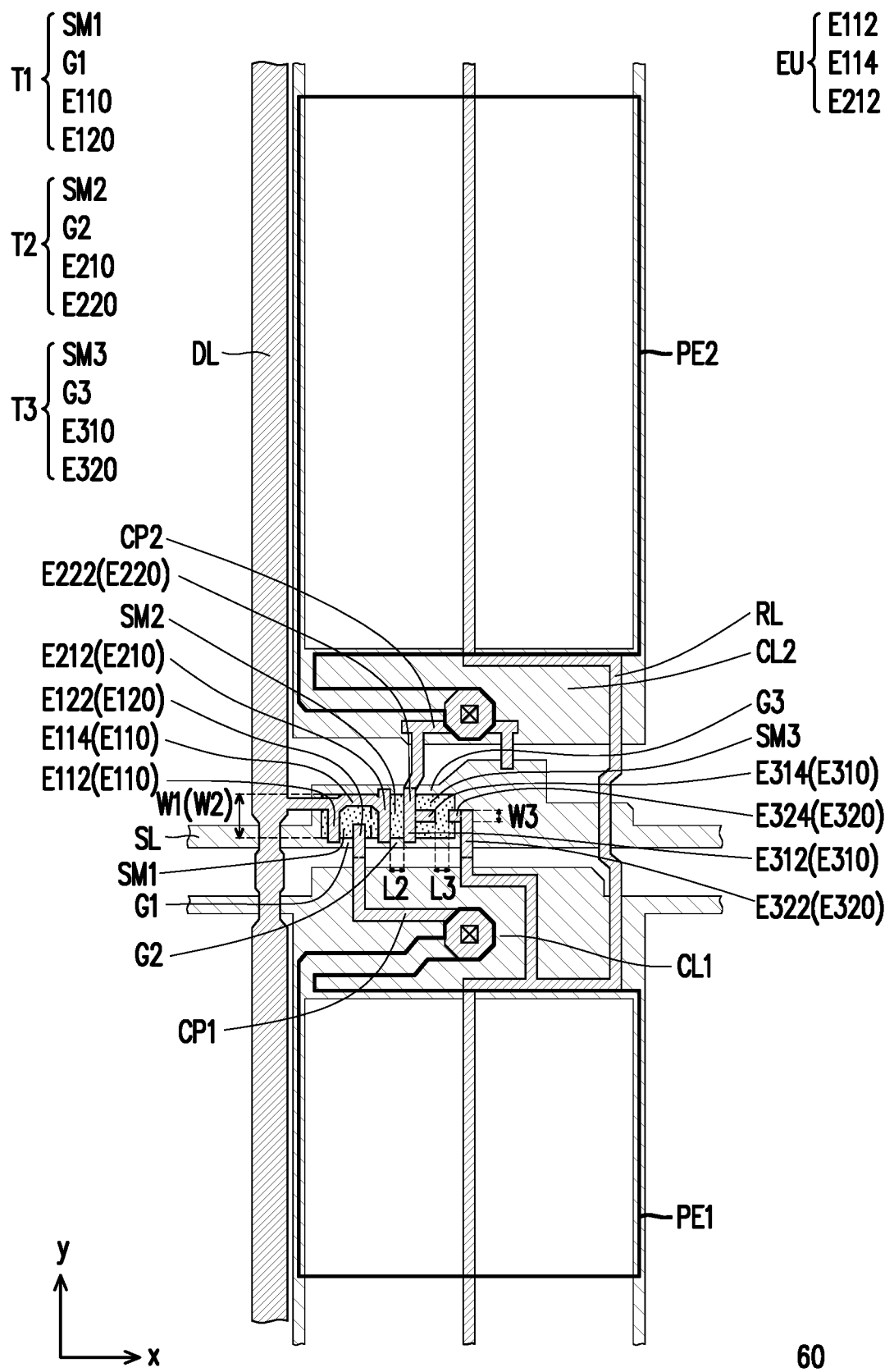
FIG. 6 is a schematic top view of a pixel structure according to yet another embodiment of the disclosure.

FIG. 6 is a schematic top view of a pixel structure according to yet another embodiment of the disclosure. It should be noted that the embodiment of FIG. 6 adopts the same reference numerals and parts of the embodiment of FIG. 5, wherein the same or similar reference numerals are used to denote the same or similar elements, and the same technical content is omitted. The omitted descriptions may be derived from the above embodiments and thus no repetition is incorporated herein.

The main difference between the embodiment of FIG. 6 and the embodiment of FIG. 5 is that the first electrode E310 of the third transistor T3 further has a transverse line portion E314.

Referring to FIG. 6, in a pixel structure 60 of the embodiment, the first electrode E310 of the third transistor T3 further has a first transverse line portion E314. The first transverse line portion E314 is located within the normal projection region of the third semiconductor pattern SM3. The first transverse line portion E314 is intersected with and connected to the straight line portion E312 of the first electrode E310 of the third transistor T3. In the embodiment, since the first electrode E310 of the third transistor T3 has the first transverse line portion E314 and the second electrode E320 of the third transistor T3 has the transverse line portion E324, the current generated by the third transistor T3 of the pixel structure 60 is more stable than the current generated by the third transistor T3 of the pixel structure 50 (shown in FIG. 5).

Similarly, in the pixel structure 60 of an embodiment of the disclosure, the first electrode E210 of the second transistor T2, the second electrode E220 of the second transistor T2, and the first electrode E310 of the third transistor T3 have a plurality of straight line portions E212, E222, and E312, and both ends of each of the straight line portions E212, E222, and E312 are located outside the normal projection regions of the first semiconductor pattern SM1, the second semiconductor pattern SM2, and the third semiconductor pattern SM3. In this manner, after the reliability test, the degree of the electrically biased of the second transistor T2 can be closer to the degree of the electrically biased of the third transistor T3, so that the display panel using the pixel structure 60 is not easily affected by the difference in the degree of the electrically biased of the plurality of transistors and thus avoiding the problem of display failure (mura).

Figure 7:
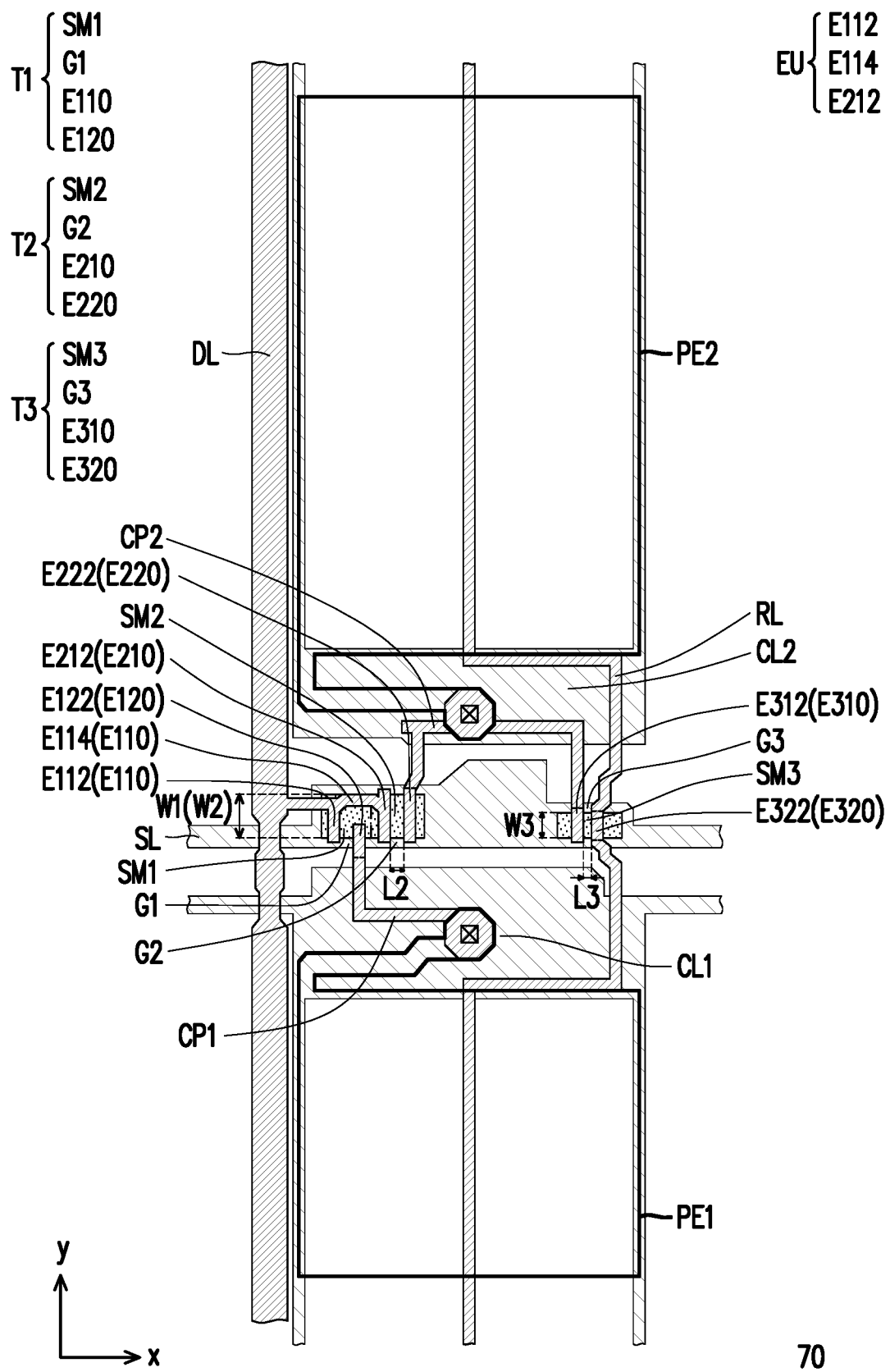
FIG. 7 is a schematic top view of a pixel structure according to still another embodiment of the disclosure.

FIG. 7 is a schematic top view of a pixel structure according to still another embodiment of the disclosure. It should be noted that the embodiment of FIG. 7 adopts the same reference numerals and parts of the embodiment of FIG. 3, wherein the same or similar reference numerals are used to denote the same or similar elements, and the same technical content is omitted. The omitted descriptions may be derived from the above embodiments and thus no repetition is incorporated herein.

The main difference between the embodiment of FIG. 7 and the embodiment of FIG. 3 is that the first semiconductor pattern SM1, the second semiconductor pattern SM2, and the third semiconductor pattern SM3 are configured differently.

Referring to FIG. 7, in a pixel structure 70 of the embodiment, the first semiconductor pattern SM1 of the first transistor T1 is directly connected to the second semiconductor pattern SM2 of the second transistor T2, and the third semiconductor pattern SM3 of the third transistor T3 is separated from the first semiconductor pattern SM1 and the second semiconductor pattern SM2.

In the embodiment, the second semiconductor pattern SM2 of the second transistor T2 has a channel width W2 in the first direction y, and the third semiconductor pattern SM3 of the third transistor T3 has a channel width W3 in the first direction y, W3<W2.

In the embodiment, the second transistor T2 has a channel length L2 between the first electrode E210 and the second electrode E220 in the second direction x, and the third transistor T3 has the channel length L3 between the first electrode E310 and the second electrode E320 in the second direction x, L3<L2.

Similarly, in the pixel structure 70 of an embodiment of the disclosure, the first electrode E210 of the second transistor T2, the second electrode E220 of the second transistor T2, and the first electrode E310 of the third transistor T3 have a plurality of straight line portions E212, E222, and E312, and both ends of each of the straight line portions E212, E222, and E312 are located outside the normal projection regions of the first semiconductor pattern SM1, the second semiconductor pattern SM2, and the third semiconductor pattern SM3. In this manner, after the reliability test, the degree of the electrically biased of the second transistor T2 can be closer to the degree of the electrically biased of the third transistor T3, so that the display panel using the pixel structure 70 is not easily affected by the difference in the degree of the electrically biased of the plurality of transistors and thus avoiding the problem of display failure (mura).

Figure 8:
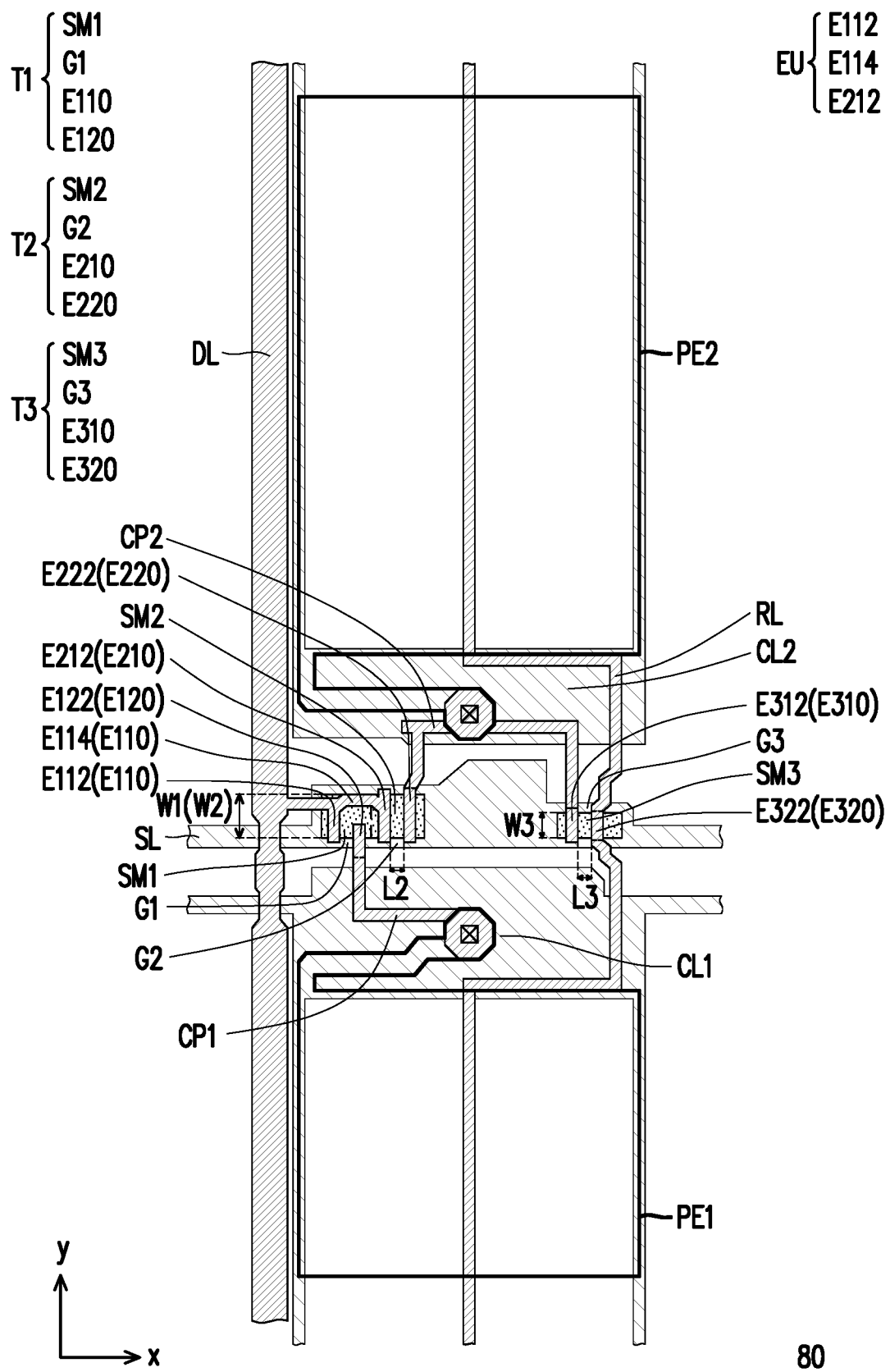
FIG. 8 is a schematic top view of a pixel structure according to yet another embodiment of the disclosure.

FIG. 8 is a schematic top view of a pixel structure according to yet another embodiment of the disclosure. It should be noted that the embodiment of FIG. 8 adopts the same reference numerals and parts of the embodiment of FIG. 7, wherein the same or similar reference numerals are used to denote the same or similar elements, and the same technical content is omitted. The omitted descriptions may be derived from the above embodiments and thus no repetition is incorporated herein.

The main difference between the embodiment of FIG. 8 and the embodiment of FIG. 7 is that the size relationships between the channel length L3 and the channel length L2 are different.

Referring to FIG. 8, in a pixel structure 80 of the embodiment, the second transistor T2 has a channel length L2 between the first electrode E210 and the second electrode E220 in the second direction x, and the third transistor T3 has a channel length L3 between the first electrode E310 and the second electrode E320 in the second direction x, L3=L2.

Similarly, in the pixel structure 80 of an embodiment of the disclosure, the first electrode E210 of the second transistor T2, the second electrode E220 of the second transistor T2, and the first electrode E310 of the third transistor T3 have a plurality of straight line portions E212, E222, and E312, and both ends of each of the straight line portions E212, E222, and E312 are located outside the normal projection regions of the first semiconductor pattern SM1, the second semiconductor pattern SM2, and the third semiconductor pattern SM3. In this manner, after the reliability test, the degree of the electrically biased of the second transistor T2 can be closer to the degree of the electrically biased of the third transistor T3, so that the display panel using the pixel structure 80 is not easily affected by the difference in the degree of the electrically biased of the plurality of transistors and thus avoiding the problem of display failure (mura).

Figure 9:
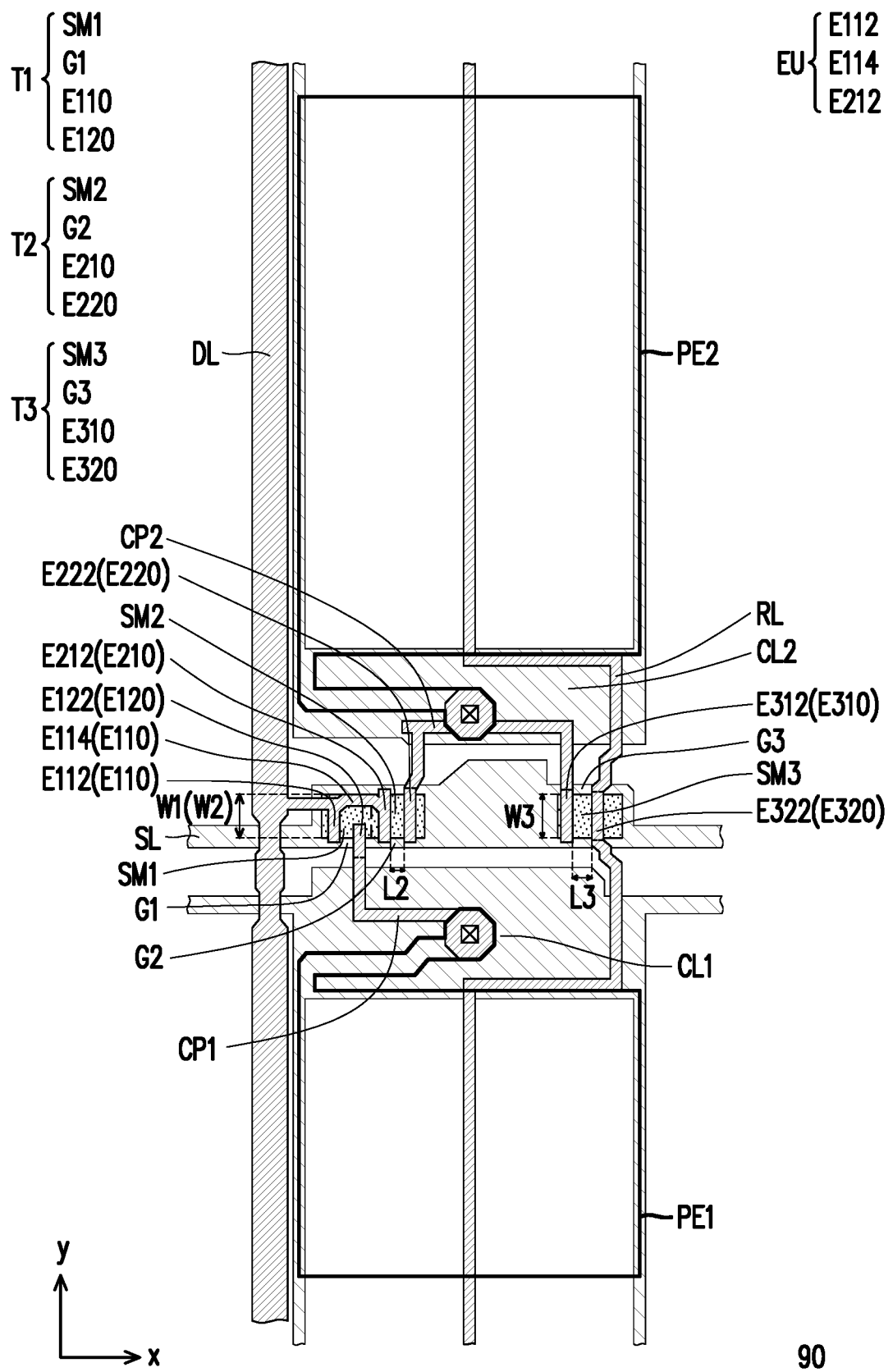
FIG. 9 is a schematic top view of a pixel structure according to still another embodiment of the disclosure.

FIG. 9 is a schematic top view of a pixel structure according to still another embodiment of the disclosure. It should be noted that the embodiment of FIG. 9 adopts the same reference numerals and parts of the embodiment of FIG. 7, wherein the same or similar reference numerals are used to denote the same or similar elements, and the same technical content is omitted. The omitted descriptions may be derived from the above embodiments and thus no repetition is incorporated herein.

The main difference between the embodiment of FIG. 9 and the embodiment of FIG. 7 is that the size relationships between the channel width W3 and the channel width W2 are different, and the size relationships between the channel length L3 and the channel length L2 are different.

Referring to FIG. 9, in a pixel structure 90 of the embodiment, the second semiconductor pattern SM2 of the second transistor T2 has a channel width W2 in the first direction y, and the third semiconductor pattern SM3 of the third transistor T3 has a channel width W3 in the first direction y, W3=W2.

In the embodiment, the second transistor T2 has a channel length L2 between the first electrode E210 and the second electrode E220 in the second direction x, and the third transistor T3 has the channel length L3 between the first electrode E310 and the second electrode E320 in the second direction x, L3>L2, L3<4×L2.

Similarly, in the pixel structure 90 of an embodiment of the disclosure, the first electrode E210 of the second transistor T2, the second electrode E220 of the second transistor T2, and the first electrode E310 of the third transistor T3 have a plurality of straight line portions E212, E222, and E312, and both ends of each of the straight line portions E212, E222, and E312 are located outside the normal projection regions of the first semiconductor pattern SM1, the second semiconductor pattern SM2, and the third semiconductor pattern SM3. In this manner, after the reliability test, the degree of the electrically biased of the second transistor T2 can be closer to the degree of the electrically biased of the third transistor T3, so that the display panel using the pixel structure 90 is not easily affected by the difference in the degree of the electrically biased of the plurality of transistors and thus avoiding the problem of display failure (mura).

Figure 10:
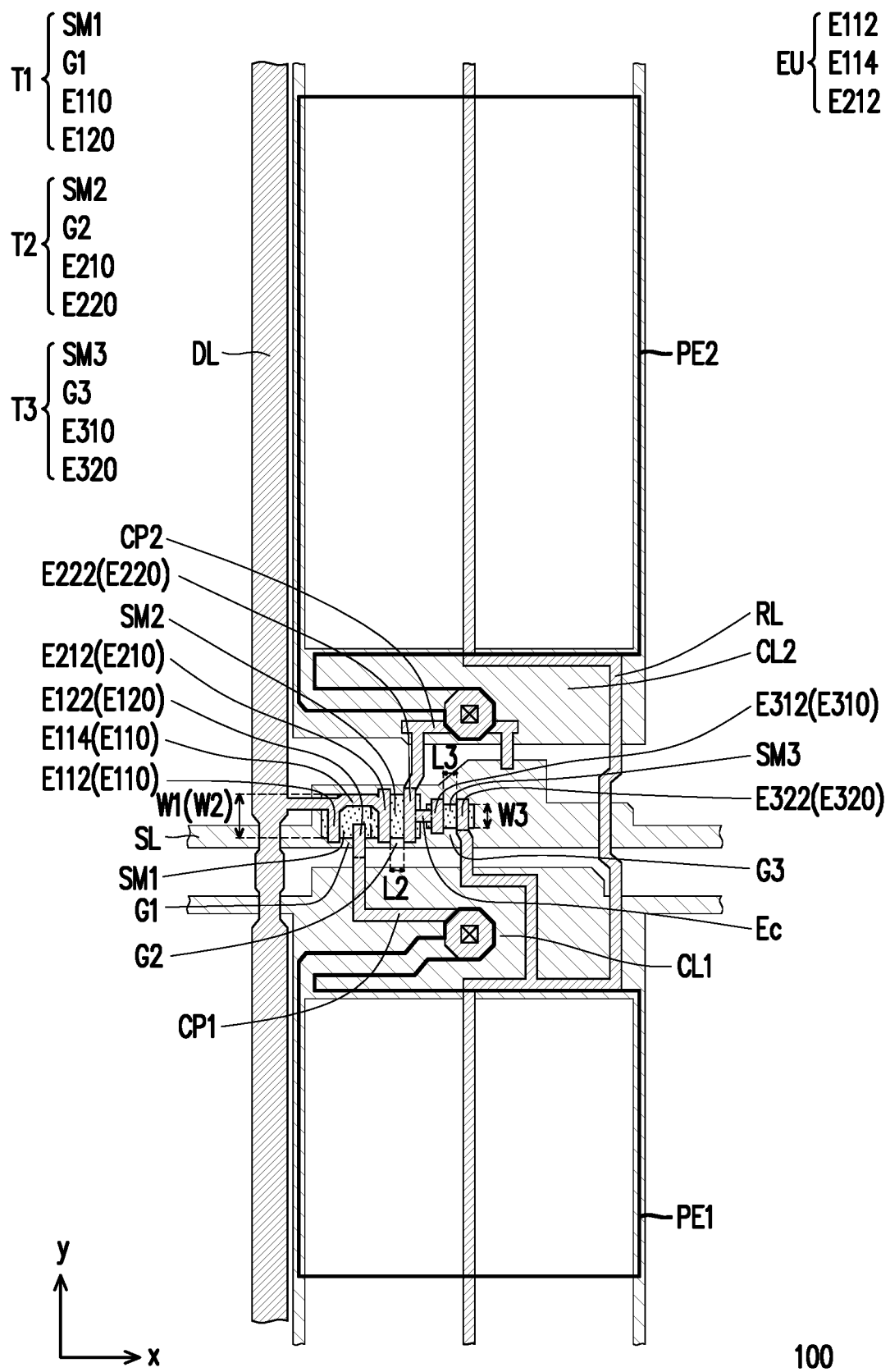
FIG. 10 is a schematic top view of a pixel structure according to yet another embodiment of the disclosure.

FIG. 10 is a schematic top view of a pixel structure according to yet another embodiment of the disclosure. It should be noted that the embodiment of FIG. 10 adopts the same reference numerals and parts of the embodiment of FIG. 8, wherein the same or similar reference numerals are used to denote the same or similar elements, and the same technical content is omitted. The omitted descriptions may be derived from the above embodiments and thus no repetition is incorporated herein.

The main difference between the embodiment of FIG. 10 and the embodiment of FIG. 8 is that a pixel structure 100 further includes a connection portion Ec that is extended in the second direction x and overlaps the scan line SL.

Referring to FIG. 10, in the pixel structure 100 of the embodiment, a connection portion Ec is further provided between the second electrode E220 of the second transistor T2 and the first electrode E310 of the third transistor T3. The connection portion Ec is intersected with and connected to the straight line portion E222 of the second electrode E220 of the second transistor T2. The connection portion Ec is intersected with and connected to the straight line portion E312 of the first electrode E310 of the third transistor T3. In the embodiment, a portion of the connection portion Ec is located within the normal projection region of the second semiconductor pattern SM2, and a portion of the connection portion Ec is located within the normal projection region of the third semiconductor pattern SM3, but the disclosure is not limited thereto.

Similarly, in the pixel structure 100 of an embodiment of the disclosure, the first electrode E210 of the second transistor T2, the second electrode E220 of the second transistor T2, and the first electrode E310 of the third transistor T3 have a plurality of straight line portions E212, E222, and E312, and both ends of each of the straight line portions E212, E222, and E312 are located outside the normal projection regions of the first semiconductor pattern SM1, the second semiconductor pattern SM2, and the third semiconductor pattern SM3. In this manner, after the reliability test, the degree of the electrically biased of the second transistor T2 can be closer to the degree of the electrically biased of the third transistor T3, so that the display panel using the pixel structure 100 is not easily affected by the difference in the degree of the electrically biased of the plurality of transistors and thus avoiding the problem of display failure (mura).

In summary, the pixel structure in an embodiment of the disclosure includes a scan line, a data line, a reference voltage line, a first transistor, a second transistor, a third transistor, a first pixel electrode, and a second pixel electrode, wherein each of the transistors has a first electrode and a second electrode respectively, the first electrode of the second transistor, the second electrode of the second transistor, and the first electrode of the third transistor have a plurality of straight line portions, and the plurality of straight line portions overlap the second semiconductor pattern and the third semiconductor pattern. In particular, both ends of each straight line portions are located outside the normal projection regions of the first semiconductor pattern, the second semiconductor pattern, and the third semiconductor pattern. In this manner, after the reliability test, the degree of the electrically biased of the second transistor can be closer to the degree of the electrically biased of the third transistor, so that the display panel using the pixel structure in an embodiment of the disclosure is not easily affected by the difference in the degree of the electrically biased of the plurality of transistors and thus avoiding the problem of display failure (mura), thereby improving display quality of the display panel.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A pixel structure, comprising:
a scan line;
a data line intersected with the scan line;
a reference voltage line, spaced apart from the data line and intersected with the scan line;
a first transistor, having a first semiconductor pattern, a gate, and a first electrode and a second electrode separated from each other and electrically connected to the first semiconductor pattern;
a second transistor, having a second semiconductor pattern, a gate, a first electrode and a second electrode separated from each other and electrically connected to the second semiconductor pattern;
a third transistor, having a third semiconductor pattern, a gate, a first electrode and a second electrode separated from each other and electrically connected to the third semiconductor pattern;
a first pixel electrode and a second pixel electrode;
wherein,
the gate of the first transistor, the gate of the second transistor, and the gate of the third transistor are electrically connected to the scan line, the first electrode of the first transistor and the first electrode of the second transistor are electrically connected to the data line, the second electrode of the second transistor is electrically connected to the first electrode of the third transistor, the second electrode of the third transistor is electrically connected to the reference voltage line, an area of the first pixel electrode is smaller than an area of the second pixel electrode, the second electrode of the first transistor is electrically connected to the first pixel electrode, and the second electrode of the second transistor is electrically connected to the second pixel electrode;
the first electrode of the second transistor, the second electrode of the second transistor, and the first electrode of the third transistor have a plurality of straight line portions, and the straight line portions overlap the second semiconductor pattern and the third semiconductor pattern, and both ends of each of the straight line portions are located outside normal projection regions of the first semiconductor pattern, the second semiconductor pattern, and the third semiconductor pattern;
the first electrode of the first transistor comprises a U-shaped portion overlapping the first semiconductor pattern, and one of the straight line portions of the first electrode of the second transistor comprises a portion of the U-shaped portion of the first electrode;
a curved section of the U-shaped portion is located within the normal projection region of the first semiconductor pattern.

2. The pixel structure according to claim 1, wherein both ends of the U-shaped portion are located outside the normal projection regions of the first semiconductor pattern, the second semiconductor pattern, and the third semiconductor pattern.

3. The pixel structure according to claim 1, wherein the first electrode of the first transistor and the first electrode of the second transistor are connected to form an n-type conductive pattern.

4. The pixel structure according to claim 1, wherein the straight line portions of the first electrode of the second transistor, the second electrode of the second transistor, and the first electrode of the third transistor are extended in a first direction; in a second direction intersected with the first direction, the second transistor has a channel length L2 between the first electrode of the second transistor and the second electrode of the second transistor; in the first direction, the second semiconductor pattern of the second transistor has a channel width W2; in the second direction, the third transistor has a channel length L3 between the first electrode of the third transistor and the second electrode of the third transistor; and in the first direction, the third semiconductor pattern of the third transistor has a channel width W3; (W3/L3)<(W2/L2).

5. The pixel structure according to claim 4, wherein W3<W2, and L3<L2.

6. The pixel structure according to claim 4, wherein W3<W2, and L3=L2.

7. The pixel structure according to claim 4, wherein W3=W2, and L3>L2.

8. The pixel structure according to claim 1, wherein the first semiconductor pattern is directly connected to the second semiconductor pattern, and the third semiconductor pattern is separated from the first semiconductor pattern and the second semiconductor pattern.

9. The pixel structure according to claim 1, wherein the first semiconductor pattern, the second semiconductor pattern, and the third semiconductor pattern are directly connected.

10. The pixel structure according to claim 9, wherein the straight line portions of the first electrode of the second transistor, the second electrode of the second transistor, and the first electrode of the third transistor are extended in a first direction; in the first direction, the second semiconductor pattern of the second transistor has a channel width W2; in the first direction, the third semiconductor pattern of the third transistor has a channel width W3; W3<W2, the second semiconductor pattern and the third semiconductor pattern are directly connected to form a corner, one of the straight line portions of the second electrode of the second transistor overlaps the corner, and a line width of one of the straight line portions of the second electrode of the second transistor is larger than a line width of one of the straight line portions of the first electrode of the second transistor.

11. The pixel structure according to claim 1, wherein the second electrode of the third transistor has a straight line portion, and both ends of the straight line portion of the second electrode of the third transistor are located outside the normal projection regions of the first semiconductor pattern, the second semiconductor pattern, and the third semiconductor pattern.

12. The pixel structure according to claim 11, wherein the straight line portion of the second electrode of the third transistor, the first electrode of the second transistor, the second electrode of the second transistor and the straight line portions of the first electrode of the third transistor are disposed in parallel.

13. The pixel structure according to claim 1, wherein the first electrode of the third transistor further has a first transverse line portion, the first transverse line portion is located within a normal projection region of the third semiconductor pattern, the first transverse line portion is intersected with and connected to one of the straight line portions of the first electrode of the third transistor.

14. The pixel structure according to claim 13, wherein the second electrode of the third transistor has a second transverse line portion, the second transverse line portion is intersected with one of the straight line portions of the first electrode of the third transistor, and one end of the second transverse line portion is located within a normal projection region of the third semiconductor pattern.

15. The pixel structure according to claim 13, wherein the second electrode of the third transistor has a second transverse line portion, the second transverse line portion is intersected with one of the straight line portions of the first electrode of the third transistor; the first electrode of the second transistor, the second electrode of the second transistor and the straight line portions of the first electrode of the third transistor are extended in a first direction; in the first direction, the third semiconductor pattern of the third transistor has a channel width W3; a line width of the second transverse line portion is smaller than the channel width W3.

16. The pixel structure according to claim 1, wherein the second electrode of the third transistor has a second transverse line portion, the second transverse line portion is intersected with one of the straight line portions of the first electrode of the third transistor, and one end of the second transverse line portion is located within a normal projection region of the third semiconductor pattern.

17. The pixel structure according to claim 1, wherein the second electrode of the third transistor has a second transverse line portion, the second transverse line portion is intersected with one of the straight portions of the first electrode of the third transistor; the straight line portions of the first electrode of the second transistor, the second electrode of the second transistor and the first electrode of the third transistor are extended in a first direction; in the first direction, the third semiconductor pattern of the third transistor has a channel width W3; a line width of the second transverse line portion is smaller than the channel width W3.

* * * * *